(12) United States Patent
Liu et al.

(10) Patent No.: US 6,313,629 B1
(45) Date of Patent: Nov. 6, 2001

(54) PRESCAN CALIBRATION OF SPATIALLY DEPENDENT DATA ERRORS IN SINGLE ECHO SEQUENCES

(75) Inventors: Xecheng Liu, Solon; Francis H. Bearden, Twinsburg, both of OH (US)

(73) Assignee: Picker International, Inc., Highland Heights, OH (US)

( * ) Notice: Subject to any disclaimer, the term of this patent is extended or adjusted under 35 U.S.C. 154(b) by 0 days.

(21) Appl. No.: 09/444,609

(22) Filed: Nov. 23, 1999

(51) Int. Cl.$^7$ .................................................. G01V 3/00
(52) U.S. Cl. ................................. 324/309; 324/307
(58) Field of Search ................................. 324/309, 307, 324/306, 312, 314, 300

(56) References Cited

U.S. PATENT DOCUMENTS 5,151,656 * 9/1992 Maie et al. ............................. 324/309
5,621,321 * 4/1997 Liu et al. ............................. 324/309
5,825,185 * 10/1998 Liu et al. ............................. 324/309

* cited by examiner

*Primary Examiner*—Louis Arana
(74) *Attorney, Agent, or Firm*—Fay, Sharpe, Fagan, Minnich & McKee, LLP

(57) ABSTRACT

A method of magnetic resonance imaging includes subjecting a number of regions of an object being imaged to a magnetic resonance calibration pulse sequence. Each calibration pulse sequence generates a single calibration echo. Each of the calibration echoes are collected and therefrom correction factors are generated. Thereafter, the method includes subjecting the regions of the object being imaged to a plurality of magnetic resonance imaging pulse sequences. Each of the imaging pulse sequences generates a single imaging echo. Each imaging echo is collected into k-space as a plurality of sampled data points. The plurality of sampled data points are adjusted in accordance with the correction factors as each imaging echo is collected into k-space.

15 Claims, 3 Drawing Sheets

PRESCAN CALIBRATION OF SPATIALLY DEPENDENT DATA ERRORS IN SINGLE ECHO SEQUENCES

BACKGROUND OF THE INVENTION

The present invention relates to the art of magnetic resonance imaging (MRI). It finds particular application in conjunction with multi-slice acquisitions employing single echo MRI pulse sequences such as field echo (FE) and spin echo (SE) sequences, and will be described with particular reference thereto. However, it is to be appreciated that the present invention is also amenable to other like applications.

Commonly, in MRI, a substantially uniform, temporally constant main magnetic field, $B_0$, is set up in an examination region in which a subject being imaged is placed. Via magnetic resonance radio frequency (RF) excitation and manipulations, selected magnetic dipoles in the subject which are otherwise aligned with the main magnetic field are tipped (via RF pulses) into a plane transverse to the main magnetic field such that they precess or resonate. In turn, the resonating dipoles are allowed to decay or realign with the main magnetic field thereby inducing magnetic resonance echoes. The various echoes making up the MRI signal are encoded via magnetic gradients set up in the main magnetic field. The raw data from the MRI apparatus is collected into a matrix commonly known as k-space. Typically, each echo is sampled a plurality of times to generate a data line or row of data points in k-space. The echo or data lines position in k-space is determined by its gradient encoding. Ultimately, employing Inverse Fourier or other known transformations, an image representation of the subject is reconstructed from the k-space data.

At times, due to non-ideal system performance or in the case of some specific data acquisition strategies, MRI signals are distorted or contaminated in either phase or amplitude leading to data inconsistencies in k-space. One potential inconsistency is that from row to row in k-space, each resonance excitation is not precisely the same amplitude or the same phase. Consequently, the result is degraded image quality. Generally, traditional methods of addressing this problem are designed to minimize those known factors affecting image quality, such as gradient non-linearity, etc. One of these methods is, for example, to over sample and use the additionally generated and collected echoes to provide correction factors which are used to adjust the k-space data and compensate for the data inconsistencies. However, while adding proportionally small amounts of time to longer imaging sequences having multi-echo echo-trains, the introduction of these additional echoes, termed navigator echoes, proportionally lengthens imaging sequences by larger amounts for single echo pulse sequences such as SE and/or FE sequences.

Moreover, commonly the navigator echoes are collected at the end of the imaging pulse sequences. Accordingly, data throughput is slowed. That is to say, processing of the k-space image data is delayed until the navigator echoes are collected and processed to generate the correction factors which will operate on the k-space data. As well, the raw MRI data has to be stored until it can be adjusted. Therefore, the efficient throughput achieved by parallel or pipeline data processing is impeded as the correction factors are not readily available upon collection of the relevant k-space data.

The present invention contemplates a new and improved technique for addressing k-space data inconsistencies which overcomes the above-referenced problems and others.

SUMMARY OF THE INVENTION

In accordance with one aspect of the present invention, a method of magnetic resonance imaging is provided. The method includes subjecting a number of regions of an object being imaged to a magnetic resonance calibration pulse sequence. Each calibration pulse sequence generates a single calibration echo. Each of the calibration echoes are collected and therefrom correction factors are generated. Thereafter, the method includes subjecting the regions of the object being imaged to a plurality of magnetic resonance imaging pulse sequences. Each of the imaging pulse sequences generates a single imaging echo. Each imaging echo is collected into k-space as a plurality of sampled data points. The plurality of sampled data points are adjusted in accordance with the correction factors as each imaging echo is collected into k-space.

In accordance with another aspect of the present invention, a magnetic resonance imaging apparatus includes a main magnet that generates a temporally constant main magnetic field through an examination region in which an object being imaged is placed. A magnetic gradient generator produces magnetic gradients in the main magnetic field across the examination region. A transmission system includes an RF transmitter that drives an RF coil which is proximate to the examination region. A sequence control manipulates the magnetic gradient generator and the transmission system to produce a plurality of MRI pulse sequences including: (i) a number of calibration sequences which generate calibration echoes, each calibration sequence generating one calibration echo emanating from each of a plurality of slices of the object being imaged; and (ii) a plurality of imaging sequences, each imaging sequence generating one imaging echo such that multiple imaging echoes emanate from each slice. A reception system includes a receiver that receives the calibration echoes and the imaging echoes. A data correction processor determines an image data correction factor from the calibration echoes. The image data correction factor is applied to image data from the imaging echoes prior to the image data filling in k-space. Finally, a reconstruction processor accesses the image data in k-space to reconstruct an image representation of the object, and an output device converts the image representation into a human viewable display.

One advantage of the present invention is short imaging sequences.

Another advantage of the present invention is improved image quality and artifact elimination.

Still further advantages and benefits of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENTS

Figure 1:
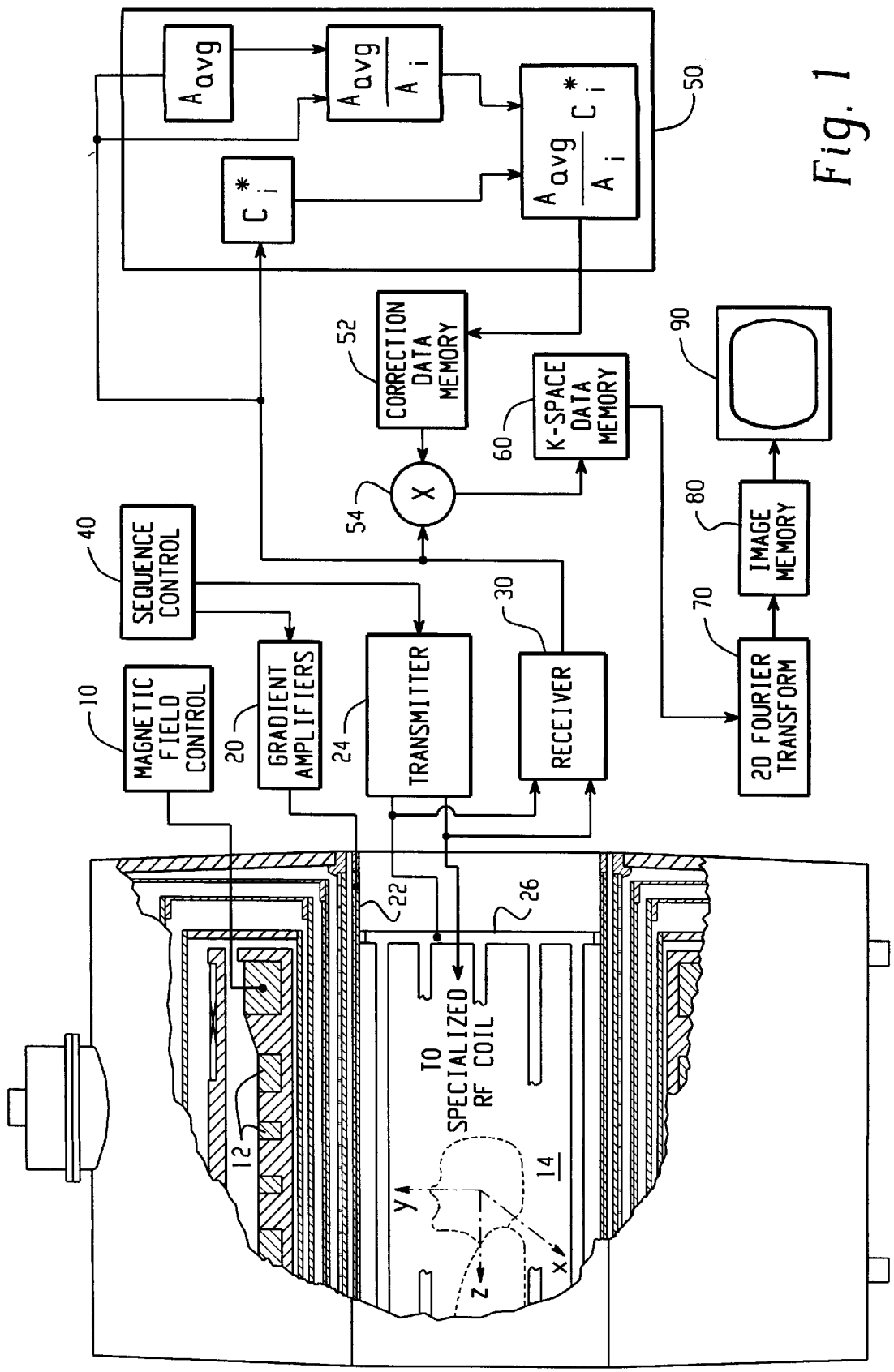
FIG. 1 is a diagrammatic illustration of an MRI apparatus in accordance with aspects of the present invention.

With reference to FIG. 1, a main magnetic field control 10 controls superconducting or resistive magnets 12 such that a substantially uniform, temporally constant main magnetic field, $B_0$, is created along a z axis through an examination region 14. A couch (not illustrated) suspends and/or positions an object to be examined, such as a patient or phantom, within the examination region 14. A magnetic resonance echo means applies a series of RF and magnetic field gradient pulses to invert or excite magnetic spins, induce magnetic resonance, refocus magnetic resonance, manipulate magnetic resonance, spatially and otherwise encode the magnetic resonance, to saturate spins, and the like to generate MRI sequences. More specifically, gradient pulse amplifiers 20 apply current pulses to selected ones or pairs of gradient coil assemblies 22 to create magnetic field gradients along x, y, and z axes of the examination region 14. An RF transmitter 24 drives a whole-body RF coil 26 to transmit RF pulses or pulse packets into the examination region 14. A typical RF pulse is composed of a packet of immediately contiguous pulse segments of short duration, which taken together with each other and any applied gradients, achieve a selected magnetic resonance manipulation. For whole-body applications, the resonance signals or echoes are commonly picked up by the whole-body RF coil 26.

For generating images of local regions of the subject, specialized RF coils are placed contiguous to the selected region of interest. For example, an insertable RF coil may be inserted surrounding a selected region at the isocenter of the bore. The insertable RF coil is used to excite magnetic resonance and receive magnetic resonance signals emitted from the patient in the region being examined. Alternatively, the insertable RF coil can be used to only receive resonance signals introduced by the whole-body RF coil 26. In any event, the resultant RF signals are picked up by the whole-body RF coil 26, the insertable RF coil, a surface coil, or another specialized RF coil and demodulated by a receiver 30. A sequence control circuit 40 controls the gradient pulse amplifiers 20 and the transmitter 24 to produce a plurality of MRI pulse sequences that generate the echoes received and sampled by the receiver 30. Preferably, the imaging experiment conducted is a multi-slice experiment which obtains image data from a plurality of cross-sectional slices of the object being imaged, for example, stacked multi-slice volume MRI experiments, magnetic resonance angiogram (MRA) experiments, Sliding INterleaved $k_y$ (SLINKY) acquisition, shifted interleaved multi-volume acquisition (SIMVA), etc.

Figure 2A:
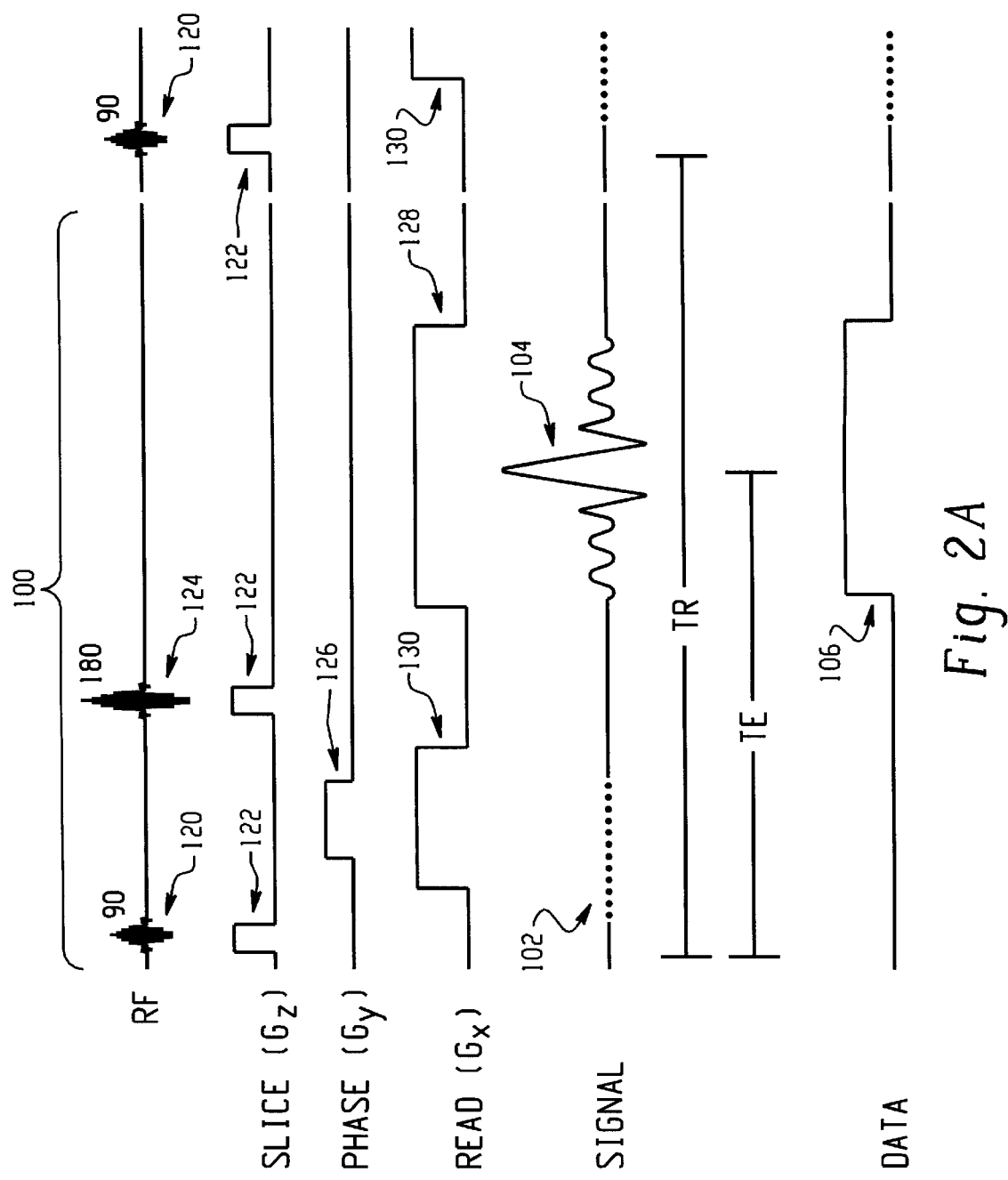
FIG. 2A is timing diagram showing a SE imaging pulse sequence employed in accordance with aspects of the present invention; and, FIG. 2B is timing diagram showing a FE imaging pulse sequence employed in accordance with aspects of the present invention.
Figure 2B:
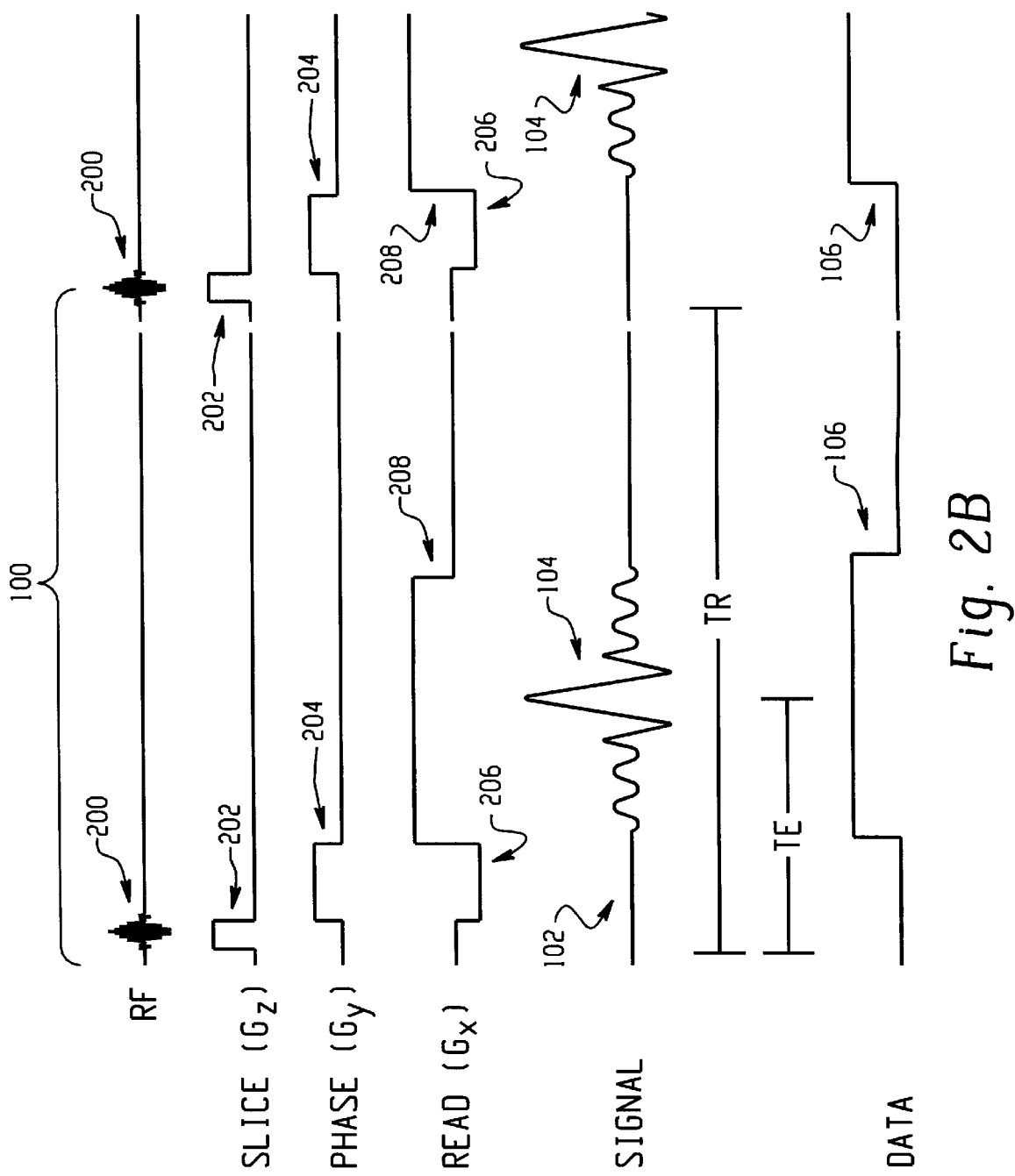

More specifically, the imaging experiment is described by way of the example MRI pulse sequences depicted in FIGS. 2A and 2B. Each MRI pulse sequence 100 generates an MR signal 102 which emanates from the object being imaged. Preferably, the MR signal 102 includes a single imaging echo 104. In one preferred embodiment of the present invention, the MRI pulse sequence 100 is an SE sequence which generates a single imaging echo 104, namely a spin echo (see FIG. 2A). Alternately, the MRI pulse sequence 100 is an FE sequence which generates a single imaging echo 104, namely a field or gradient echo (see FIG. 2B). In any event, the imaging echoes are collected within a data acquisition window 106.

Regarding FIG. 2A, the timing diagram or pulse diagram for a spin-echo (SE) imaging sequence has entries for the RF pulses, the gradients in the magnetic field, and the MR signal. The MRI pulse sequence begins with a slice selective 90° flip-angle RF excitation pulse 120 generated by the RF transmitter 24 applied in conjunction with a slice selection gradient. The slice select gradient pulse 122 is applied to the gradient coil assembly 22 to select a cross-sectional slice of the object in which resonance is to be excited and from which the imaging echo is ultimately to issued. After a period of time equal to TE/2 elapses, a slice selective 180° flip-angle RF refocusing pulse 124 is applied, again in conjunction with the slice selection gradient pulse 122.

A phase encoding gradient pulse 126 is applied between the 90° and 180° RF pulses 120 and 124, respectively. The received imaging echo 104 is phase encoded along a first direction within the selected slice via the phase encode pulse 126 applied to the gradient coil assembly 22. From imaging sequence to imaging sequence, each individual imaging echo 104 is distinctly phase encoded (preferably, e.g., in uniform integer steps) by varying the amplitude and/or duration of the phase encoding gradient pulse 126 applied in each imaging sequence. Optionally, the phase encoding gradient pulse 126 is applied after the 180° RF pulse 124. However, in order to minimize the TE period, the phase encoding gradient pulse 126 is applied between the 90° and 180° RF pulses 120 and 124, respectively.

A readout or frequency encoding gradient pulse 128 is applied to the gradient coil assembly 22 after the 180° RF pulse 124 during the time that the imaging echo 104 is collected. The recorded MR signal 102 is the imaging echo 104, in this case, a spin-echo. The frequency encoding gradient pulse 128 is applied to the gradient coil assembly 22 to frequency encode the received imaging echo 104 along a second direction (preferably, orthogonal to the first or phase encoding direction) within the selected slice.

Preferably, one additional gradient pulse 130 is applied between the 90° and 180° RF pulses 120 and 124, respectively. This gradient is along the same direction as the frequency encoding gradient. It dephases the spins so that they will rephase by the center of the echo. This gradient in effect prepares the MR signal 102 to be at the edge of k-space by the start of the acquisition of the imaging echo 104.

The entire MRI pulse sequence 100 is repeated every TR seconds until all the phase encoding steps have been recorded.

Regarding FIG. 2B, the gradient echo or field echo (FE) imaging sequence is described by way of its timing diagram or pulse sequence diagram. In the FE imaging sequence, a slice selective RF pulse 200 is applied to the imaged object. This RF pulse 200 typically produces a flip-angle of between 10° and 90°. In like manner to the SE imaging sequence, a slice selection gradient pulse 202 is applied to the gradient coil assembly 22 in conjunction with the RF pulse 200. A phase encoding gradient pulse 204 is applied next as was done in the SE sequence.

A dephasing gradient pulse 206 is applied at the same time as the phase encoding gradient pulse 204 so as to cause the spins to be in phase at the center of the acquisition period. This dephasing gradient pulse 206 is negative in sign from that of a frequency encoding gradient pulse 208 turned on during the acquisition of the imaging echo 104. The imaging echo 104 (in this case, a gradient or field echo) is produced when the frequency encoding gradient pulse 208 is turned on because this gradient refocuses the dephasing which occurred from the dephasing gradient pulse 206.

The period designated as the echo time (TE) is defined as the time between the start of the RF excitation pulse and the maximum in the MR signal 102. Again, the imaging sequence is repeated every TR seconds with the imaging echoes 104 from each repetition getting a distinct phase encoding.

In a preferred embodiment, just prior to conducting an imaging experiment, an calibration run is carried out. The calibration run is preferably conducted using the same MRI pulse sequence used in the imaging experiment. Ultimately, information gleaned from the calibration echoes is used to correct or adjust sampled data points in k-space to account for data inconsistencies resulting from non-ideal system performance and other error or image artifact causing factors. The information obtained optionally relates to phase errors in the imaging echoes and/or amplitude deviations in the imaging echoes.

One calibration MRI pulse sequence is generated, and hence, one calibration echo is collected, for each slice or slab from which imaging echoes 104 will be collected during the multi-slice imaging experiment. Preferably, for signal to noise ratio (SNR) considerations, the phase encoding gradient is preferably zeroed or nulled for the calibration echoes. Alternately, the phase encoding is a non-zero constant for each of the plurality of calibration MRI pulse sequences.

With reference again to FIG. 1 and continuing reference to FIGS. 2A and 2B, the sequence control 40 initiates and directs the calibration run such that the calibration echoes are received by the receiver 30. The receiver 30 samples each calibration echo a plurality of times resulting in data lines or arrays of sampled data points representing each calibration echo. In a preferred embodiment, a data processor 50 calculates, generates, or otherwise determines error factors from the calibration echoes and stores them in a correction data memory or buffer 52. The error factors include measures of phase error and scaled values of the average amplitude of the calibration echoes 104.

With respect to the phase errors, each individual calibration echo is used to correct phase errors in those imaging echoes 104 collected from the same slice. In the preferred embodiment, the excitation of resonance and the 180° resonance reversal are designed to have zero phase offset, and there is no phase encoding applied to the calibration echo. Accordingly, the calibration echo has the same phase as at the initial excitation. However, the phase at excitation may vary from excitation to excitation. In this manner, phase offsets between echoes are potentially introduced.

The phase angle of each calibration echo relative to a preselected arbitrary reference angle is determined. The phase angle offset of each calibration echo relative to the reference phase angle is used to correct all of the image data from the corresponding slice. More specifically, a unit vector $c_i^*$ is determined for the $i^{th}$ calibration echo that will adjust its phase to the reference angle. Each data line from the $i^{th}$ slice is multiplied by the unit vector $c_i^*$ to standardize the phase. In this manner, the reference phase of all the data lines in k-space are standardized.

With respect to the amplitude deviations, in a preferred embodiment, scaled values of the average amplitude of all the collected calibration echoes are used to correct amplitude deviations therefrom in all the imaging echoes 104 collected into k-space. The amplitude of all the calibration echoes is averaged. The amplitude of each individual echo is compared to the average. All imaging echoes 104 from a given slice are scaled in accordance with the deviation between its calibration echo and the average. In the preferred embodiment, the ratio of the amplitude $A_i$ of the $i^{th}$ calibration echo to the average amplitude $A_{avg}$ is determined. Each line in k-space is then multiplied by $(A_{avg}/A_i)c_i^*$ to standardize its phase and amplitude.

Optionally, the scaling factor used is linear, exponential, or otherwise as desired. By adjusting the relevant k-space data, the imaging echoes (which otherwise have amplitudes that deviate from their corresponding average amplitude as determined from the scaled values of the average amplitude of the calibration echoes) are corrected such that they have uniform amplitudes across MR signals 102. Preferably, the uniform amplitude to which they are corrected is in fact the corresponding average amplitude determined in accordance with the scaled values of the average amplitude of all the collected calibration echoes.

At the conclusion of the calibration run or just thereafter, the sequence control 40 initiates and directs the imaging experiment. That is to say, the sequence control 40 coordinates the plurality of MRI pulse sequences 100 that generate the MR signals 102 received by the receiver 30. For the selected sequence, the receiver 30 samples each imaging echo 104 a plurality of times resulting in data lines or arrays of sampled data points representing each imaging echo 104. As each imaging echo 104 is collected and/or sampled by the receiver 30, the relevant image data gets corrected by the error factors from the correction data buffer 52. Preferably, a multiplier 54 multiplies the sampled data points from each $i^{th}$ slice by the factor $k_i=(A_{avg}/A_i)c_i^*$. In this manner the raw MR image data is processed in pipeline fashion as it gets loaded into a k-space data memory or buffer 60.

With regard to the k-space data buffer 60, corrected data lines from the imaging echoes 104 are loaded into a matrix otherwise known as k-space. In a preferred embodiment, each of the imaging echoes 104 is mapped into its own corresponding row or horizontal line of k-space such that each successively sampled data point value occupies successive columns. The row each echo is assigned to is based on the particular phase encoding imparted thereto via the phase encoding gradient pulses. In a preferred embodiment, a first collected imaging echo 104 is mapped to a central line of k-space while successively collected echoes are mapped to further out lines of k-space in a progressive manner alternating between positive (i.e., above the central or zero phase encode line) and negative (i.e., below the central line) k-space. Hence, later collected echoes end up filling the outermost portions of k-space. Alternately, other techniques, as are known in the art, are used to control the manner in which k-space is filled including, e.g., filling k-space using non-Cartesian trajectories.

Preferably after k-space has been filled, a multi-dimensional Fourier transform and/or other appropriate reconstruction algorithms are applied thereto by a reconstruction processor 70. That is to say, the reconstruction processor 70 accesses the k-space data buffer 60 and performs on the adjusted or corrected k-space data therein a Fourier transformation and/or other appropriate algorithms, as are known in the art, to reconstruct an image representation of the object being imaged. The image may represent a planar slice through the patient, an array of parallel planar slices, a three-dimensional volume, or the like. The image is then stored in an image memory 80 where it is accessed by a display, such as a video monitor 90 or other human viewable display or output device that provides a rendering of the resultant image.

While the invention herein has been described with reference to the MRI apparatus detailed above, it is appreciated that the invention is applicable to other MRI apparatus. For example, the invention is equally amenable to open geometry magnets wherein opposing pole pieces, optionally joined by a ferrous flux return path, define an open examination region therebetween. Moreover, while described above in terms of two-dimensional (2D) or cross-sectional slice imaging, the invention is equally applicable to three-dimensional (3D) or volume imaging wherein a volume of the object is excited rather than a slice. Likewise, while described above in terms of an FE and SE pulse sequences, other MRI pulse sequences may be equally applicable. Optionally, the data storage devices employed herein are random access memory (RAM), optical or electro-magnetic disks, etc. In addition, while referred to separately, the data storage devices herein are optionally separately addressable regions of a single data storage device. The data processing is alternately carried out via hardware or software implementations or combinations of both.

Generally, the invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A method of magnetic resonance imaging, said method comprising:
    (a) subjecting a number of regions of an object being imaged to a magnetic resonance calibration pulse sequence, each calibration pulse sequence generating a single calibration echo;
    (b) collecting each of said calibration echoes;
    (c) generating correction factors from said calibration echoes;
    (d) subjecting the regions of the object being imaged to a plurality of magnetic resonance imaging pulse sequences, each of said imaging pulse sequences generating a single imaging echo; and,
    (e) collecting each imaging echo into k-space as a plurality of sampled data points, said plurality of sampled data points being adjusted in accordance with the correction factors as each imaging echo is collected into k-space.

2. The method according to claim 1, wherein the magnetic resonance imaging pulse sequence is selected from a group consisting of a spin echo sequence, and a field echo sequence.

3. The method according to claim 2, wherein the magnetic resonance calibration sequence is the same as the magnetic resonance imaging sequence.

4. The method according to claim 1, wherein the correction factors adjust the sampled data points to correct for phase error in the collected imaging echoes.

5. The method according to claim 1, wherein the correction factors adjust the sampled data points to correct for amplitude error in the collected imaging echoes.

6. The method according to claim 1, wherein the calibration echoes have no phase encoding.

7. The method according to claim 1, wherein the regions represent parallel planar cross-sectional slices through the object being imaged.

8. A method of multi-slice magnetic resonance imaging comprising:
    (a) subjecting a number of slices of an object being imaged to a magnetic resonance calibration pulse sequence, each calibration pulse sequence generating a calibration echo associated with a particular slice;
    (b) collecting each of said calibration echoes;
    (c) generating correction factors for each slice from said calibration echoes, said correction factor for an $i^{th}$ slice being given by:

$$(A_{avg}/A_i)c_i^*$$

wherein, $A_{avg}$ is an average amplitude of the calibration echoes, $A_i$ is the amplitude of the calibration echo associated with the $i^{th}$ slice, and $c_i^*$ is a unit vector with an angular orientation corresponding to a phase angle of the calibration echo associated with the $i^{th}$ slice;
    (d) subjecting the slices of the object being imaged to a plurality of magnetic resonance imaging pulse sequences, each of said imaging pulse sequences generating an imaging echo; and,
    (e) collecting each imaging echo into k-space as a plurality of sampled data points; and,
    (f) adjusting each of the sampled data points in accordance with the correction factor for the corresponding slice to which the sampled data point belongs.

9. A magnetic resonance imaging apparatus comprising:
    a main magnet that generates a temporally constant main magnetic field through an examination region in which an object being imaged is placed;
    a magnetic gradient generator that produces magnetic gradients in the main magnetic field across the examination region;
    a transmission system which includes an RF transmitter that drives an RF coil which is proximate to the examination region;
    a sequence control which manipulates the magnetic gradient generator and the transmission system to produce a plurality of MRI pulse sequences including (i) a number of calibration sequences which generate calibration echoes, each calibration sequence generating one calibration echo emanating from each of a plurality of slices of the object being imaged and (ii) a plurality of imaging sequences, each imaging sequence generating one imaging echo such that multiple imaging echoes emanate from each slice;
    a reception system which includes a receiver that receives the calibration echoes and the imaging echoes;
    a data correction processor which determines an image data correction factor from the calibration echoes, said image data correction factor being applied to image data from the imaging echoes prior to the image data filling in k-space;
    a reconstruction processor that accesses the image data in k-space to reconstruct an image representation of the object; and,
    an output device that converts the image representation into a human viewable display.

10. The magnetic resonance imaging apparatus according to claim 9, wherein the imaging sequence is selected from a group consisting of a spin echo sequence and a field echo sequence.

11. The magnetic resonance imaging apparatus according to claim 10, wherein the calibration sequence is the same as the imaging sequence.

12. The magnetic resonance imaging apparatus according to claim 9, wherein the data correction factor adjusts the image data to correct for phase error in the imaging echoes.

13. The magnetic resonance imaging apparatus according to claim 9, wherein the data correction factor adjusts the image data to correct for amplitude error in the imaging echoes.

14. The magnetic resonance imaging apparatus according to claim 9, wherein the data correction processor:

(a) determines a phase angle of each calibration echo;

(b) an amplitude variance of each calibration echo relative to the amplitudes of the other calibration echoes; and, (c) corrects the image data in accordance with (i) the determined phase angle and (ii) the determined amplitude variance.

15. A magnetic resonance imaging apparatus comprising:

means for generating a calibration echo emanating from each of a plurality of slices of an object being imaged;

means for generating imaging echos emanating from the slices;

a reception system that receives the calibration echoes and the imaging echoes; and, a data correction processor which determines image data correction factors from the calibration echoes, said image data correction factors being applied to sampled image data from the imaging echoes;

wherein for each slice the image data correction factor is given by:

$$(A_{avg}/A_i)c_i^*$$

wherein, $A_{avg}$ is an average amplitude of the calibration echoes, $A_i$ is the amplitude of the calibration echo from the $i^{th}$ slice, and $c_i^*$ is a unit vector with an angular orientation corresponding to a phase angle of the calibration echo from the $i^{th}$ slice.

* * * * *

UNITED STATES PATENT AND TRADEMARK OFFICE
CERTIFICATE OF CORRECTION

PATENT NO.    : 6,313,629 B1
DATED         : November 6, 2001
INVENTOR(S)   : Liu et al.

It is certified that error appears in the above-identified patent and that said Letters Patent is hereby corrected as shown below:

<u>Title page,</u>
Please correct the listing of the Inventors as follows: -- [75] Inventors: Kecheng Liu, Solon; Francis H. Bearden, Twinsburg, both of OH (US) --

Signed and Sealed this

Sixteenth Day of April, 2002

Attest:

JAMES E. ROGAN
*Attesting Officer*   *Director of the United States Patent and Trademark Office*